United States Patent [19]

Imai et al.

[11] Patent Number: 5,576,148
[45] Date of Patent: Nov. 19, 1996

[54] PROCESS FOR PRODUCTION OF PRINTED CIRCUIT BOARD

[75] Inventors: Genji Imai; Yukari Takeda, both of Hiratsuka; Hideo Kogure, Atsugi; Naozumi Iwasawa, Hiratsuka, all of Japan

[73] Assignee: Kansai Paint Co., Ltd., Hyogo-ken, Japan

[21] Appl. No.: 382,155

[22] Filed: Feb. 1, 1995

[30] Foreign Application Priority Data

Feb. 1, 1994 [JP] Japan ................................. 6-027596

[51] Int. Cl.⁶ ........................................................ G03F 7/00
[52] U.S. Cl. ........................... 430/314; 430/318; 430/319; 216/17; 216/18; 216/19
[58] Field of Search ............................... 216/17, 18, 19; 430/14, 314, 318, 319

[56] References Cited

U.S. PATENT DOCUMENTS

| | | | |
|---|---|---|---|
| 4,746,399 | 5/1988 | Demmes et al. | 216/17 |
| 4,766,055 | 8/1988 | Kawabata et al. | 430/281 |
| 4,983,252 | 6/1991 | Masui et al. | 156/630.1 |
| 5,045,434 | 9/1991 | Yoshihara et al. | 430/286 |
| 5,102,775 | 4/1992 | Okuhara et al. | 430/286 |
| 5,344,740 | 9/1994 | Iwasawa et al. | 430/190 |

FOREIGN PATENT DOCUMENTS

| | | | |
|---|---|---|---|
| 50-6401 | 1/1975 | Japan. | |
| 50-139692 | 11/1975 | Japan. | |
| 61-233736 | 10/1986 | Japan. | |
| 63-25998 | 2/1988 | Japan. | |
| 63-224393 | 9/1988 | Japan. | |
| 2-251195 | 10/1990 | Japan | 216/17 |
| 3-175691 | 7/1991 | Japan. | |
| 6-295064 | 10/1994 | Japan. | |

*Primary Examiner*—John A. McPherson
*Attorney, Agent, or Firm*—Wenderoth, Lind & Ponack

[57] ABSTRACT

The present invention provides a process for producing a high-density printed wiring board with plated throughholes, at high productivity and reliability by a direct drawing method. The process comprises making throughholes in a substrate having an electro-conductive layer on each side; conducting plating on at least the walls of the substrate throughholes; forming a photosensitive resist film on each side of the substrate; applying an actinic radiation onto the resist film by a direct drawing method in the shape of a pattern to be obtained when the resist film is a negative type, or in the shape of a pattern reverse to a pattern to be obtained when the resist film is a positive type; forming, on the uncoated portion inside the throughholes by electrodeposition, an electrodeposition film which is insoluble in a developing solution used later and an etching solution used later but is removable with a peeling solution used later; conducting development with an appropriate developing solution to remove the resist film; removing the exposed plating layer portion and the electro-conductive layer portion present therebeneath, by etching; and then peeling the remaining resist film and the electrodeposition film inside the throughholes, with an appropriate peeling solution.

13 Claims, No Drawings

PROCESS FOR PRODUCTION OF PRINTED CIRCUIT BOARD

BACKGROUND OF THE INVENTION

1. Field of the Invention

The present invention relates to a process for producing a high-density printed circuit board with plated throughholes, at high reproducibility and productivity.

2. Description of the Prior Art

In recent years, attention has been paid to processes for producing a printed wiring board by applying an actinic radiation in the shape of a pattern to be obtained, using no photomask, for example, by applying, onto a resist coated on a copper-clad laminated substrate or the like, a laser beam (e.g. an argon ion laser beam) of raster mode which is controlled by CAD data and which goes on and off at a high speed in correspondence to the shape of a pattern to be formed (this is a direct drawing method by laser), or by applying an actinic radiation onto a copper-clad laminated substrate via a liquid crystal projector, because the above processes can assure a high alignment accuracy required in the production of printed wiring board used for high-density multilayer printed wiring board and also allow for production of high-density printed wiring board in many kinds and small quantities.

As the resist usable in the above processes, a resist to which a laser beam (e.g. an argon ion laser beam) is applicable, is disclosed in Japanese Patent Application Kokai (Laid-Open) No. 233736/1986 and Japanese Patent Application Kokai (Laid-Open) No. 31848/1987 (corresponding to U.S. Pat. No. 4,766,055). Also, a resist composition of high photosensitivity very suitable for the above processes is disclosed by the present inventors in Japanese Patent Application Kokai (Laid-Open) No. 223759/1991 (corresponding to U.S. Pat. No. 5,045,434).

With these resists, however, it is impossible to form a conductor circuit on a wiring substrate with plated throughholes, only by coating them on a copper-clad laminated substrate. The present inventors previously proposed, in Japanese Patent Application Kokai (Laid-Open) No. 179064/1991 (corresponding to U.S. Pat. No. 5,102,775), Japanese Patent Application Kokai (Laid-Open) No. 223759/1991 (corresponding to U.S. Pat. No. 5,045,434), etc., a resist suitable for use in the above processes, which is coatable even on the plated areas of the walls of substrate throughholes by electrodeposition and which is curable by the use of an argon ion laser beam or the like. It is extremely difficult, however, to sufficiently irradiate the resist coated on the walls of throughholes, with a laser beam and cure the coated resist, making impossible the actual formation of highly reliable throughholes.

Meanwhile, when an actinic radiation is applied via a liquid crystal projector, irradiation of throughhole inside is possible, for example, by applying an actinic radiation as a scattered light or by allowing a light source to scan. Even with these methods, however, it is impossible to completely irradiate the resist present inside the fine throughholes of 0.3 mm or less in diameter and cure the resist to a required extent. Also in such irradiation methods, the parallelism of applied light is lost; the sufficient irradiation of throughholes makes excessive the irradiation of the resist present on the copper foil; thereby, the resolution of pattern is reduced. Thus, with these methods, it is generally impossible to produce a high-density printed circuit board having throughholes, at high reliability.

In order to solve the above problem, there was proposed, in Japanese Patent Application Kokai (Laid-Open) No. 175691/1991, a process for forming a wiring board by protecting throughholes with a hole-filling ink and then coating a resist and further by using a direct drawing method. This process using a hole-filling ink, however, has many problems as pointed out in Japanese Patent Application Kokai (Laid-Open) No. 25998/1988, etc. and is not preferable as a process for producing a high-density printed circuit board.

In order to eliminate the problems of the process using a hole-filling ink, there was proposed, in Japanese Patent Application Kokai (Laid-Open) No. 25998/1988, a process for producing a printed wiring board with plated throughholes, which comprises forming, by electrodeposition, a resin layer on both sides of a throughholes-plated substrate as well as on the entire walls of the substrate throughholes, removing only the resin layer present on both sides of the substrate, forming a resist film on both sides of the substrate in the shape of a pattern to be obtained, removing, by etching, the electro-conductive metal layer and the plating layer formed thereon, both of the substrate portion having no resist film thereon, and removing the resist film and the resin layer inside the throughholes.

Even in this process, however, the resin layer formed by electrodeposition on the areas other than throughholes must be removed by polishing or the like, and some of the problems of the process using a hole-filling ink, for example, the bad working environment invited by the resin powder generating during polishing remains unresolved.

For the removal of the electrodeposition resin film present on the areas other than throughholes, a method of buffing, paper polishing or the like is described in Japanese Patent Application Kokai (Laid-Open) No. 25998/1988. However, in order to completely remove, by buffing, paper polishing or the like, the resin film present in the vicinity of fine throughholes of 300 μm or less in diameter without damaging the resin film present at each throughhole corner, close attention must be paid and a long time is required. Moreover, remaining, on the substrate, of even a very small amount of the resin powder generating during the removal of the resin film gives rise to circuit defects such as wire breakage, shortcircuiting and the like, leading to reduced yield particularly in production of high-density printed wiring board.

Further in Japanese Patent Application Kokai (Laid-Open) No. 224393/1988 was proposed a process for producing a printed wiring board with plated throughholes, which comprises forming, on both sides of a substrate with plated throughholes, a resist film in the shape of a pattern reverse to a circuit pattern to be obtained, forming an electrodeposition resin layer by electrodeposition on the walls of the substrate throughholes as well as on the portion of each side of the substrate having no resist film, heat-treating the electrodeposition resin layer, removing only the resist film, removing, by etching, the plating layer portion (exposed by the removal of the resist film) and the electro-conductive metal layer portion present therebeneath, and removing the electrodeposition resin layer.

The above process is free from the problems of the process using a hole-filling ink and requires no removal of electrodeposition resin film mentioned in Japanese Patent Application Kokai (Laid-Open) No. 25998/1988. In the process, however, the resist film formed in the shape of a reverse pattern after the formation of the electrodeposition resin layer must be removed selectively. This removal becomes difficult often as the circuit pattern becomes a higher density, the line width of pattern becomes smaller and the space between lines becomes smaller, which produces defective products.

SUMMARY OF THE INVENTION

The primary object of the present invention is to provide a process for producing a high-density printed wiring board with plated throughholes, at high productivity and reliability by a direct drawing method.

The present inventors made a study in order to solve the above-mentioned problems of conventional processes for production of printed wiring board with plated throughholes. As a result, the present inventors found out that by forming a photosensitive resist film on both sides of a wiring substrate with plated throughholes, irradiating the resist film with a radiation by a direct drawing method in the shape of a pattern to be obtained, and forming a electrodeposition film on the walls of the substrate throughholes, the problems of the prior art, i.e. the step of removing the electrodeposition film coated on the areas other than the throughhole inside and the step of selectively removing the resist resin film formed in a reverse pattern becomes unnecessary, whereby said problems of the prior art can be solved completely and a high-density printed wiring board with plated throughholes can be produced at very high productivity and reliability by a direct drawing method. The finding has led to the completion of the present invention.

The present invention provides:

a process for producing a printed circuit board, which comprises:

(1) a step of making throughholes in a substrate having an electro-conductive layer on each side and then conducting plating on at least the walls of the substrate throughholes, (2) a step of forming a photosensitive resist film of negative type on each side of the substrate, (3) a step of applying an actinic radiation onto the resist film by a direct drawing method in the shape of a pattern to be obtained, (4) a step of applying, on the walls of the throughholes by electrodeposition, an electropaint capable of forming a film which is insoluble in a developing solution used later and an etching solution used later but is removable with a peeling solution used later, (5) a step of conducting development with an appropriate developing solution to remove the radiation-non-irradiated portion of the photosensitive resist film of negative type, (6) a step of removing the exposed plating layer portion and the electro-conductive layer portion present therebeneath, by etching, and (7) a step of simultaneously or separately peeling the remaining photosensitive resist film and the electrodeposition film inside the throughholes, with an appropriate peeling solution (this process is hereinafter referred to as the first aspect of the present invention), and a process for producing a printed circuit board, which comprises:

(1) a step of making throughholes in a substrate having an electro-conductive layer on each side and then conducting plating on at least the walls of the substrate throughholes, (2) a step of forming a photosensitive resist film of positive type on each side of the substrate, (3) a step of applying an actinic radiation onto the resist film by a direct drawing method in the shape of a pattern reverse to a pattern to be obtained, (4) a step of applying, on the walls of the throughholes by electrodeposition, an electropaint capable of forming a film which is insoluble in a developing solution used later and an etching solution used later but is removable with a peeling solution used later, (5) a step of conducting development with an appropriate developing solution to remove the radiation-irradiated portion of the photosensitive resist film of positive type, (6) a step of the exposed plating layer portion and the electro-conductive layer portion present therebeneath, by etching, and (7) a step of simultaneously or separately peeling the remaining photosensitive resist film and the electrodeposition film inside the throughholes, with an appropriate peeling solution (this process is hereinafter referred to as the second aspect of the present invention).

DESCRIPTION OF SPECIFIC EMBODIMENTS

The present process for producing a printed wiring board with plated throughholes is hereinafter described in detail.

Step (1)

The substrate having an electro-conductive layer on each side, used as a starting material in the present invention includes, for example, a copper-clad substrate or an aluminum foil-laminated substrate each obtained by laminating an electro-conductive material (e.g. a copper foil or an aluminum foil) of given thickness on each side of an organic or inorganic insulating material such as glass-epoxy composite material, ceramic or the like.

In this step, throughholes of given size and number are first made in the substrate in accordance with the circuit design prepared beforehand. This throughhole making can be conducted by means of drill, laser beam, press or the like ordinarily used.

Then, the substrate in which throughholes have been made, are subjected to plating. The plating is carried out by plating an electro-conductive material (e.g. copper or nickel) on at least the walls of the substrate throughholes according to an ordinary method such as electroless plating method, electroplating method or the like.

Step (2)

In the first aspect of the present invention, a photosensitive resist of negative type which is cured and becomes insoluble when irradiated with an actinic radiation, is coated on the substrate obtained in the step (1), by a per se known method such as spin coating, spraying, roll coating, curtain flow coating or the like; then, heating is applied at a temperature of generally 150° C. or less, preferably 120° C. or less for about 1–30 minutes; thereby, a resist film is formed.

The photosensitive resist of negative type used for the formation of a resist film in the first aspect of the present invention includes, for example, a liquid photosensitive composition comprising:

an unsaturated resin crosslinkable or polymerizable when irradiated with a light, such as an acrylic resin, a polyester resin, a urethane resin, an epoxy resin, a polybutadiene resin or the like all having a polymerizable unsaturated group in the side chain or the backbone chain, generally, a volatile solvent and/or a compound having at least one polymerizable unsaturated group in the molecule [e.g. (meth)acrylic acid ester], a photopolymerization initiator (e.g. benzoin or benzoin ethyl ether), a saturated resin, and as necessary, additives such as fluidity controller, extender pigment, coloring agent, dye and the like.

When there is used, as the actinic radiation, a visible light such as visible laser beam or the like, it is possible to use, as the photopolymerization initiator, a visible light polymerization initiator (e.g. titanocene compound), a combination of a visible light polymerization initiator and a sensitizer (e.g. a coumarin derivative), etc. [Japanese Patent Application Kokai (Laid-Open) No. 223759/1991 (corresponding to U.S. Pat. No. 5,045,434)].

In the second aspect of the present invention, a film of a photosensitive resist of positive type which becomes soluble in a developing solution when irradiated with an actinic radiation, is formed on the substrate obtained in the step (1), in the same manner as in the first aspect of the present invention.

The photosensitive resist of positive type used in the formation of a resist film in the second aspect of the present invention includes, for example, a liquid positive type photosensitive resist of quinone diazide type [e.g. Japanese Patent Application Kokai (Laid-Open) No. 6401/1975 and Japanese Patent Application Kokai (Laid-Open) No. 139692/1975], and a positive type photosensitive resist comprising a carboxyl group-containing polymer, a poly(vinyl ether) compound and a compound capable of generating an acid when irradiated with an actinic radiation [e.g. Japanese Patent Application Kokai (Laid-Open) No. 295064/1994]. The latter resist can form a pattern by coating said resist to form a film, heating the film to give rise to crosslinking between the carboxyl group and the vinyl ether group to make the film insoluble, and then applying an actinic radiation to generate an acid at the irradiated portion (the acid gives rise to the fission of the crosslinked structure to make the irradiated portion soluble in a developing solution used).

The formation of a resist film may be conducted simultaneously for both sides or separately for each side, depending upon the feature of the coating apparatus used.

The thickness of the resist film formed is not strictly restricted and can be varied depending upon the usage of the circuit board produced, etc. However, when the thickness is too small, the film is damaged during etching, inviting wire breakage, etc. When the thickness is too large, a low resolution is invited. Therefore, the appropriate film thickness is generally about 3–about 50 μm, particularly 5–30 μm.

In the first aspect of the present invention, in order to isolate the resist film from the oxygen in air and increase the photosensitivity, it is possible to form, on the resist film, a resin film soluble in water and/or a developing solution used and having excellent oxygen barrier property, for example, a protective film of a polyvinyl alcohol, a partially saponified polyvinyl acetate or the like. The thickness of such a resin film is not particularly restricted, but generally is preferable at about 1–10 μm because with too small a thickness, no sufficient oxygen barrier property is exhibited and, with too large a thickness, the developing speed is small.

Step (3)

In this step, the resist film on the substrate, formed in the step (2) is irradiated with a light for pattern formation. This irradiation is conducted by applying an actinic radiation by a direct drawing method in the shape of a pattern to be obtained in the first aspect of the present invention and in the shape of a pattern reverse to a pattern to be obtained in the second aspect of the present invention.

The irradiation with an actinic radiation can be conducted by a so-called photomaskless method (a method of irradiation using no photomask) using, for example, a laser beam (e.g. an argon ion laser beam) of raster mode which is controlled by CAD data and which goes on and off at a high speed in correspondence to the shape of a pattern to be obtained, or a liquid crystal projector.

The actinic radiation used for the irradiation is selected from a visible light, an ultraviolet light, etc. depending upon the properties of the photosensitive resist used. When a laser beam is used, an argon ion laser beam is preferable because it can easily be produced as a stable beam of high intensity.

Step (4)

In this step, an electrodeposition film which is insoluble in a developing solution used later and an etching solution used later but is removable with a peeling solution used later, is formed on the resist-uncoated wall portions of throughholes, of the irradiated substrate obtained in the step (3).

The formation of this electrodeposition film can be conducted by coating an electropaint capable of forming a film of said properties, by electrodeposition. It can be conducted by an ordinary method, for example, by dipping the irradiated substrate in an electropaint bath, connecting a DC source to the substrate (used as an electrode) and an opposite electrode and passing an electricity between the electrodes under given conditions, taking out the substrate from the bath and applying post-treatments such as water washing and the like, and, as necessary, drying at a temperature of, for example, about 150° C. or less, preferably about 120° C. or less for about 1 to about 30 minutes.

The conditions used for the electrodeposition are not particularly restricted as long as the walls of throughholes are covered completely. However, the appropriate conditions are to apply, between the substrate and the opposite electrode, a DC voltage of generally 7–300 V, preferably 15–200 V generally for about 5 to about 300 seconds, preferably for about 10 to about 250 seconds.

The electropaint is not particularly restricted as long as it can form a film which is insoluble in a developing solution used later or an etching solution used later but is removable with a peeling solution used later. It may be thermosetting type or a thermoplastic type.

The thermosetting electropaint includes, for example, an aqueous solution or aqueous dispersion obtained by neutralizing a composition composed mainly of a resin having, in the molecule, an ion-forming group and a curable or crosslinkable group or a functional group reactive with a crosslinking agent (these groups make the resin water-soluble or water-dispersible when neutralized), or an aqueous solution or aqueous dispersion obtained by neutralizing a composition composed mainly of a mixture of said resin and a crosslinking agent.

The above resin has no particular restriction with respect to its skeleton, and there can be used a resin whose skeleton is, for example, an alkyd resin, a polyester resin, an acrylic resin, an epoxy resin, a styrene-maleic acid (or maleic anhydride) copolymer, a polybutadiene, a vinyl acetate-acrylic acid copolymer or the like.

The ion-forming group which can be introduced into the above resin skeleton, may be an anionic type or a cationic type. The ion-forming group of anionic type includes, for example, a carboxyl group, a sulfonic acid group, a phosphoric acid group, etc. Of these, a carboxyl group is most preferable.

The introduction of the anionic group into the resin skeleton can be conducted by a per se known method. For example, the introduction into an alkyd resin or a polyester resin can be conducted, for example, by a method of controlling the moles of a polybasic acid to a polyol and introducing a desired amount of carboxyl residue into the resulting resin or by a method of synthesizing an alkyd resin or a polyester resin and then half-esterifying the part or whole of the remaining hydroxyl group with an anhydride of a polybasic acid. The introduction into an acrylic resin can be conducted, for example, by copolymerizing an acid group-containing polymerizable monomer such as acrylic acid or methacrylic acid. The introduction into an epoxy resin can be conducted, for example, by reacting an epoxy group with an acid or the like and reacting the part or whole of the resulting hydroxyl group with a polybasic acid anhydride in the same manner as mentioned above. The introduction into a polybutadiene can be conducted, for example, by adding maleic anhydride or the like. The acid anhydride present in the resin can be converted into a corresponding acid or a salt thereof by a per se known method, for example, by subjecting the acid anhydride to half-esterification with an alcohol or reacting the anhydride with an amine in the presence of water.

The curable or crosslinkable group which can be introduced into the resin skeleton, includes those known per se, such as thermopolymerizable unsaturated group, epoxy group, isocyanate group blocked with a thermally-dissociable protective group, and the like.

The introduction of the curable or crosslinkable group into the resin skeleton is not particularly restricted and can be conducted by a per se known method. The introduction of a thermopolymerizable unsaturated group into an alkyd resin can be conducted by using, at the time of synthesis of the alkyd resin, a modifier such as drying oil, semi-drying oil or fatty acid thereof. The introduction of said group into an acid- or acid anhydride-containing resin such as polyester resin, acrylic resin or the like can be conducted by reaction of said resin with aryl glycidyl ether, glycidyl (meth)acrylate or the like. The introduction of said group into a hydroxyl group-containing resin such as polyester resin, acrylic resin using a hydroxyl group-containing polymerizable monomer, or the like can be conducted by reaction of said resin with an equimolar adduct between a diisocyanate (e.g. tolylene diisocyanate or isophorone diisocyanate) and a hydroxyl group-containing polymerizable compound [e.g. aryl alcohol or hydroxyethyl (meth)acrylate], or by reaction between hydroxyl group and a vinyl ether of an alkyl halide (e.g. chloroethyl vinyl ether). The introduction of an epoxy group can be conducted, for example, by reaction between the hydroxyl group-containing resin mentioned above and epichlorohydrin.

The introduction of an isocyanate blocked with a thermally-dissociable protective group can be conducted, for example, by reaction between the hydroxyl group-containing resin mentioned above and a polyisocyanate partially blocked with a thermally-dissociable protective group (e.g. an alcohol or an oxime), or by reaction of an acrylic resin obtained by copolymerization using a monomer of the following formula (I), with an alcohol or an oxime to block the isocyanate group of the resin, or by blocking of said monomer (I) in the same manner and subsequent copolymerization.

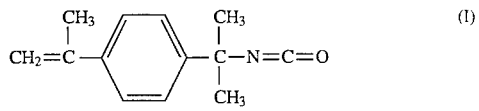

Meanwhile, the ion-forming group of cationic type includes an amino group.

The introduction of said group can be conducted by a per se known method. The introduction of said group into an alkyd resin or a polyester resin can be conducted, for example, by using, as an alcohol component, an alkanolamine such as diethanolamine, triethanolamine or the like. The introduction of said group into an acrylic resin can be conducted, for example, by copolymerizing an amino group-containing polymerizable monomer such as dimethylaminoethyl (meth)acrylate or the like, or by reacting the part or whole of the epoxy group introduced by copolymerization of glycidyl (meth)acrylate or the like, with a primary or secondary amine, or by reacting the part or whole of the unsaturated group introduced by the reaction with an unsaturated acid, with a primary or secondary amine. The introduction of said group into an epoxy resin can be conducted, for example, by treating the epoxy resin in the same manner as used for the epoxy group-containing acrylic resin.

The introduction of the curable or crosslinkable group into an amino group-containing resin can be conducted by a per se known method, for example, by reacting a polymerizable group-containing epoxy compound as mentioned above, with the amino group of said resin, or by reacting a vinyl ether of alkyl halide, epichlorohydrin or the like with the hydroxyl group or amino group of said resin, or by reacting a polyisocyanate partially blocked with a thermally-dissociable protective group, with the amino group or hydroxyl group of said resin, or by copolymerizing a compound of formula (I) blocked with a thermally-dissociable protective group.

The crosslinking agent usable is not particularly restricted as long as it reacts with each of the above-mentioned resins to form a crosslinked structure. It may be a per se known crosslinking agent and includes, for example, a polyepoxy compound, a polyisocyanate blocked with a thermally-dissociable protective group, an amino resin, a polyol compound and a polyfunctional polymerizable unsaturated compound. An appropriate crosslinking agent is selected depending upon the kind of the resin to be crosslinked.

In order to accelerate the crosslinking of the resin, the composition for thermosetting electropaint may comprise per se known catalysts such as thermally-radical-generating agent, metal salt, organometal compound of tin, zinc or the like, acid (e.g. protonic acid or Lewis acid), said acid protected with a thermally-dissociable protective group, and the like.

As the thermoplastic electropaint, there can be used an electropaint containing, as a main component, a resin having the same skeleton as mentioned in the thermosetting electropaint and an ion-forming group but having no self-crosslinkable functional group.

The film formed using the above-mentioned thermosetting or thermoplastic electropaint must be insoluble in a developing solution used and an etching solution used and must be removable with a peeling solution used. Since the developing solution and the etching solution and their use conditions differ depending upon the kind of the resist used, an appropriate paint composition satisfying the above requirements must be selected in view of the combination with the photosensitive resist actually used.

Other example of the electropaint usable includes a photosensitive electropaint of positive type [Japanese Patent Application Kokai (Laid-Open) No. 3470/1991 (corresponding to U.S. Pat. No. 5,344,740)].

These resist resins are, singly or, as necessary, after being mixed with a crosslinking agent, neutralized to obtain an electropaint used in the present invention, in the form of an aqueous solution or an aqueous dispersion. As the neutralizing agent, there can be used an organic amine, an inorganic alkali or the like when the resin contains an ion-forming group of anionic type, and an organic acid, an inorganic acid or the like when the resin is cationic type. The degree of neutralization differs depending upon the properties of the composition, but can be generally 0.1–1 equivalent, preferably 0.3–1 equivalent per mole of ion-forming group.

The electropaint composition used in the present invention may comprise a solvent and an additive both for control of electrodepositability, film spreadability, etc., and a dye or a pigment for control and confirmation of film removal or its speed.

An electropaint of anionic type is used when an alkaline developer is used for the development of the photosensitive resist; an electropaint of cationic type is used when an acidic developer is used; and an electropaint of either type is appropriately selected when a non ionic organic solvent is used.

Step (5)

The substrate whose throughhole walls have been covered with an electrodeposition film, is then subjected to development to remove the non- irradiated portion of the resist film when the film is made of a negative type photosensitive resist and the irradiated portion when the film is made of a positive type photosensitive resist, whereby a wiring pattern is formed. As the developing solution, a per se known developer can be used, and an alkaline solution, an acidic solution or an organic solvent can appropriately be selected and used depending upon the properties of the photosensitive resist used.

Step (6)

The plating layer exposed by the above development treatment and the electro-conductive layer present therebeneath, both on the substrate are removed by etching.

This etching can be conducted by a per se known method depending upon the kinds of the metals of the plating layer and the electro-conductive layer. For example, when the metal is copper, there can be used, for example, an acidic etching solution composed mainly of cupric chloride or ferric chloride, or an alkaline etching solution composed mainly of ammonia or the like.

Step (7)

Finally, the resist film remaining on the substrate and the electrodeposition film inside the throughholes are peeled. The peeling of the resist film and the electrodeposition film may be conducted simultaneously or separately.

The peeling can be conducted generally by using an alkaline peeling agent or a peeling solvent when the resist is an alkali development type, an acid peeling agent or a peeling solvent when the resist is an acidic development type, and a peeling solvent when the resist is a solvent development type. In this case, one common peeling agent may be used for the remaining resist film and the electrodeposition film inside the throughholes, or two different peeling agents may be used (one for the resist film and the other for the electrodeposition film) to conduct peeling separately.

Thus, a printed circuit can be formed on the substrate with plated throughholes.

The present process described above in detail is very suited for use in production of a printed circuit board with plated throughholes. In the present process, a photosensitive resist film is formed on the electro-conductive layer present on the wiring substrate with plated throughholes; the resist film is irradiated by a direct drawing method in the shape of a pattern; thereafter, an electrodeposition film is formed inside the throughholes. Therefore, the present process, as compared with conventional processes comprising electrodeposition inside throughholes, is advantageous in that there is required neither step of removing the electrodeposition film on the areas other than throughhole inside nor step of removing the resist film portion irradiated in the shape of a pattern reverse to a pattern to be obtained. As a result, the present process can produce, at very high productivity and reliability, a high-density wiring board having fine throughholes of 300 μm or less in diameter, by a direct drawing method.

The present invention is hereinafter described more specifically by way of Examples. In the Examples, parts and % are by weight.

SYNTHESIS EXAMPLE 1

The following materials consisting of:

| phthalic anhydride | 1,489 parts |
| trimethylolpropane | 1,608 parts |
| linseed oil fatty acid | 2,300 parts | were fed into a flask equipped with a stirrer, a dehydration section and a thermometer, and subjected to dehydration and condensation in a nitrogen stream at 230° for 5 hours. The reaction mixture was cooled to 180° C. Thereto was added 384 parts of trimellitic acid anhydride. The mixture was heated at 180° C. for 45 minutes and cooled to 150° C. The reaction mixture was diluted with ethylene glycol monobutyl ether until the solid content of the mixture became 80%.

The resulting resin had an acid value of 39 and a hydroxyl group content of 1.0 mole/kg resin.

SYNTHESIS EXAMPLE 2

A mixture consisting of:

| styrene | 364 parts |
| n-butyl methacrylate | 300 parts |
| methyl methacrylate | 160 parts |
| acrylic acid | 72 parts |
| 2-hydroxyethyl methacrylate | 104 parts |
| azobisisobutyronitrile | 10 parts | was placed in a dropping funnel and was dropwise added, in 3 hours, to 450 parts of a 50/50 (by weight) mixed solvent of 100° C. consisting of propylene glycol monomethyl ether and isopropanol, placed in a flask equipped with a stirrer, a reflux condenser and a thermometer, with nitrogen gas being blown into the flask. The mixture was kept at 100° C. for 1 hour. Thereto was dropwise added a mixture of 50 parts of the above mixed solvent and 1 part of azobisisobutyronitrile in 1 hour. The mixture was kept at 100° for 2 hours and cooled to obtain a resin solution having a solid content of 66%.

The resin had an acid value of 56, a hydroxyl group content of 0.8 mole/kg resin and a glass transition temperature (Tg) of 68° C.

SYNTHESIS EXAMPLE 3

A mixture consisting of:

| | |
|---|---|
| styrene | 350 parts |
| n-butyl methacrylate | 290 parts |
| methyl methacrylate | 150 parts |
| N,N-dimethylaminoethyl methacrylate | 94 parts |
| 2-hydroxyethyl acrylate | 116 parts |
| benzoyl peroxide | 20 parts | was polymerized in the same manner as in Synthesis Example 2 (as an additional catalyst, azobisisobyronitrile was used in place of benzoyl peroxide) to obtain a resin solution having a solid content of 66%.

The resin had an amine value of 34, a hydroxyl group content of 1.0 mole/kg resin and a glass transition temperature (Tg) of 40° C.

SYNTHESIS EXAMPLE 4

In a four-necked flask were placed 269 parts of o-naphthoquinone diazide sulfonic acid chloride and 1,345 parts of dioxane. To the mixture being stirred at room temperature was dropwise added 150 parts of N-methylethanolamine in 1 hour. After the completion of the addition, stirring was continued for about 3 hours and there was confirmed no presence of amino group absorption at or in the vicinity of 3,300 cm$^{-1}$ of IR spectrum. Then, the reaction was completed. The reaction mixture was placed in deionized water to remove the hydrochloric acid formed during the reaction. The resulting product was extracted with isobutyl acetate. The extract was subjected to distillation to remove the solvent. The residue was placed in a vacuum dryer for drying, to obtain a hydroxyl group-containing o-quinone diazide compound.

Separately, 290 parts of diethylene glycol dimethyl ether was placed in a four-necked flask and heated to 110° C. with stirring. Thereto was dropwise added, in 3 hours, a mixed solution consisting of 202 parts of n-butyl methacrylate, 32 parts of acrylic acid, 92 parts of m-isopropenyl-α,α-dimethylbenzyl isocyanate and 20 parts of azobisbutyrovaleronitrile. The mixture was kept for 1 hour. Thereto was dropwise added, in 1 hour, a mixed solution consisting of 14 parts of methyl isobutyl ketone and 3 parts of azobisbutyrovaleronitrile. The mixture was kept for 5 hours and then heated to 50° C. Thereto were added 142 parts of the previously obtained hydroxyl group-containing o-quinone diazide compound and 4.6 parts of dibutyltin diacetate. The mixture was kept for 3 hours and there was confirmed no presence of isocyanate group absorption at or in the vicinity of 2,250 cm$^{-1}$ of IR spectrum. As a result, there was obtained a positive type photosensitive resin having an acid value of 40.7, a molecular weight of 7,300 and a Tg of 51° C.

SYNTHESIS EXAMPLE 5

A mixed solution consisting of 40 parts of methyl methacrylate, 40 parts of butyl acrylate, 20 parts of acrylic acid and 2 parts of azobisisobutyronitrile was dropwise added, in 3 hours, to 90 parts of propylene glycol monomethyl ether (a hydrophilic solvent) kept at 100° C., in a nitrogen gas atmosphere. After the addition, the mixture was aged for 1 hour. Thereto was dropwise added, in 1 hour, a mixed solution consisting of 1 part of azobisdimethylvaleronitrile and 10 parts of propylene glycol monomethyl ether. The mixture was aged for 5 hours to obtain a solution of a resin of high-acid value (155). To this solution were added 24 parts of glycidyl methacrylate, 0.12 part of hydroquinone and 0.6 part of tetraethylammonium bromide. The mixture was reacted at 110° C. for 5 hours with air being blown, to obtain a solution of a photosetting resin (acid value: about 50, unsaturation degree: 1.35 moles/kg, Tg: 20° C., number-average molecular weight: about 20,000).

SYNTHESIS EXAMPLE 6

A mixture consisting of:

| | |
|---|---|
| acrylic acid | 288 parts |
| styrene | 300 parts |
| n-butyl acrylate | 255 parts |
| 2-hydroxyethyl acrylate | 157 parts |
| t-butyl peroxybenzoate | 100 parts | was dropwise added, in 2 hours, to 1,000 parts of 2-butoxyethanol being stirred at 110° C. The mixture was kept at that temperature for 2 hours to obtain a carboxyl group-containing polymer having a solid content of about 50%, a carboxyl group content of 4 moles/kg, an aromatic ring content of 20.7 weight parts per 100 weight parts of polymer, an acid value of about 224, a molecular weight of 7,200 and a Tg of 18° C.

SYNTHESIS EXAMPLE 7

In a flask were placed 1,490 parts of o-cresol, 1,145 parts of 30% formalin, 130 parts of deionized water and 6.5 parts of oxalic acid. The mixture was refluxed for 60 minutes with heating. 13.5 parts of 15% hydrochloric acid was added and the mixture was refluxed for 40 minutes with heating. 400 parts of deionized water of about 15° C. was added and the mixture was kept at about 75° C. to precipitate a resin. A 35% aqueous sodium hydroxide solution was added for neutralization. The aqueous layer was removed. 400 parts of deionized water was added to wash the resin at 75° C., and the aqueous layer was removed. The same washing procedure was repeated two more times. The resulting resin was dried at about 120° C. under vacuum to obtain a novolac phenolic resin having a molecular weight of about 600.

In a 250-ml flask were placed 15 g of the above novolac phenolic resin, 80 ml of 2-chloroethyl vinyl ether and 100 ml of toluene. After the flask was purged with nitrogen, 20 g of sodium hydroxide was placed in the flask. The mixture was heated at 80° C. for 30 minutes. Then, there was added a solution of 4.56 g of tetrabutylammonium bromide dissolved in 20 ml of 2-chloroethyl vinyl ether. The mixture was reacted at 95° C. for 5 hours. The reaction mixture was washed with deionized water three times and the oil layer was separated. The oil layer was subjected to distillation to remove unreacted 2-chloroethyl vinyl ether and toluene to obtain a vinyl ether compound. This compound had 3.5 vinyl ether groups in the molecule.

PRODUCTION EXAMPLE 1

693 parts of deionized water was gradually added to a mixture consisting of 100 parts of the resin solution obtained in Synthesis Example 1, 0.8 part of zirconium octenoate and 6.5 parts of triethylamine, with stirring using Disper, whereby an anionic thermosetting electropaint having a solid content of 10% was obtained.

PRODUCTION EXAMPLE 2

842 parts of deionized water was gradually added to a mixture consisting of 150 parts of the resin solution obtained in Synthesis Example 2 and 8 parts of triethylamine, with stirring using Disper, whereby an anionic thermoplastic electropaint having a solid content of 10% was obtained.

PRODUCTION EXAMPLE 3

598 parts of deionized water was gradually added to a mixture consisting of 150 parts of the resin solution obtained in Synthesis Example 3, 15 parts of a polyisocyanate (obtained by reacting trimethylolpropane and tolylene diisocyanate at a ratio of ⅓) blocked with methyl ethyl ketoxime, 0.5 part of dibutyltin dilaurate and 3 parts of acetic acid, with stirring using Disper, whereby a cationic thermosetting electropaint having a solid content of 15% was obtained.

PRODUCTION EXAMPLE 4

772 parts of the resin solution obtained in Synthesis Example 4 was mixed with a solution of 5 parts of a compound of the following formula (II) dissolved in 10 parts of butyl cellosolve. Thereto was added 28 parts of triethylamine for neutralization. To the reaction mixture being stirred was gradually added deionized water until the solid content of the mixture became 10%, whereby an electropaint of pH 7.8 was obtained.

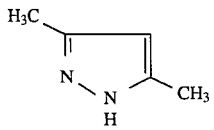
(II)

PRODUCTION EXAMPLE 5

180 parts of the photosetting resin solution having a solid content of 55.5%, obtained in Synthesis Example 5 was dissolved in 290 parts of ethyl acetate. Thereto was added a solution of 1 part of a sensitizer of the following formula (III) dissolved in 5 parts of benzyl alcohol, and the mixture was stirred sufficiently. Thereto were further added a solution of 1 part of a titanocene compound (a polymerization initiator) of the following formula (IV) dissolved in 10 parts of benzyl alcohol and a solution of 2 parts of benzotriazole of the following formula (V) dissolved in 20 parts of ethyl acetate, and the mixture was stirred sufficiently to obtain a photosensitive resist solution.

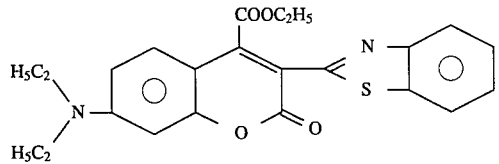
(III)

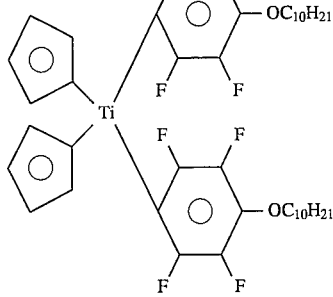
(IV)

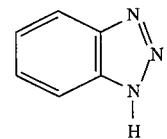
(V)

PRODUCTION EXAMPLE 6

A photosensitive resist solution was obtained in the same manner as in Production Example 5 except that 1 part of the titanocene compound as polymerization initiator was replaced by 9 parts of 3,3',4,4'-tetra(t-butylperoxycarbonyl)benzophenone.

PRODUCTION EXAMPLE 7

A mixture consisting of 200 parts of the carboxyl group-containing polymer (solid content: 50%) obtained in Synthesis Example 6, 20 parts of the vinyl ether compound obtained in Synthesis Example 7, 7.5 parts of a photochemically acid-generating agent of the following formula (VI) and 1 part of a sensitizer and coloring agent of the following formula (VII) was dissolved in diethylene glycol dimethyl ether to obtain a photosensitive resist having a solid content of 20%.

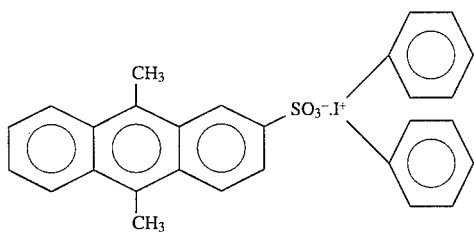

(VI)

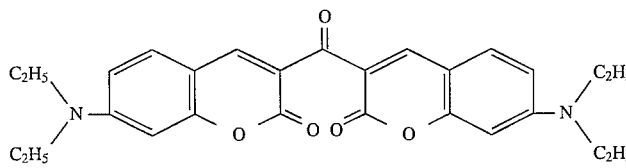

(VII)

EXAMPLE 1

The photosensitive resist obtained in Production Example 5 was coated, by electrostatic spraying, on both sides of a copper-clad glass-epoxy substrate of 1.6 mm in thickness, in a film thickness (as dried) of 7 μm. The substrate had throughholes of various diameters changing stepwise from 0.15 mm to 5.0 mm and the throughhole walls had a copper plating. The coated substrate was heated at 80° C. for 5 minutes and cooled to room temperature. Thereon was coated a 5% aqueous polyvinyl alcohol solution, by dip coating, in a film thickness (as dried) of 2 μm, followed by heating at 60° C. for 5 minutes and cooling to room temperature. The resulting substrate was irradiated with an argon ion laser beam at a dose of 1.5 mJ/cm$^2$ by a direct drawing method in the shape of a given circuit pattern having lines/spaces in the range of 30 μm/30 μm to 100 μm/100 μm.

The irradiated substrate was dipped in the electropaint bath of Production Example 1. A DC of 70 V was applied between the substrate (used as an anode) and an opposite electrode for 25 seconds. Then, the substrate was washed with water, heated at 80° C. for 10 minutes, cooled to room temperature, subjected to development with a 1% aqueous sodium hydroxide solution of 25° C., and etched with an etching solution of cupric chloride type at 45° C. Thereafter, the resist film remaining on the substrate and the electrodeposition film inside the throughholes were removed with a 30% aqueous sodium hydroxide solution of 50° C.

The thus-obtained circuit board was examined for circuit pattern and throughhole inside using a microscope of 10 magnification. As a result, circuit pattern resolution was perfect; the reproducibility of line width was very good; the copper plating inside throughholes was protected completely; and there was no defect such as partial etching of plating, color change or the like.

EXAMPLE 2

A circuit board was produced in the same manner as in Example 1 except that the photosensitive resist obtained in Production Example 6 was used, the resist film was made in a thickness of 5 μm, and the electropaint of Production Example 2 was used.

The conditions of the circuit formed and the copper plating inside throughholes were the same as in Example 1 and very good.

EXAMPLE 3

The procedure up to etching was the same as in Example 1 except that the electropaint of Production Example 3 was used and electrodeposition was conducted by applying a DC of 50 V for 45 seconds between the substrate (used as a cathode) and an opposite electrode. Then, the remaining resist film was removed with a 3% aqueous sodium hydroxide solution of 50° C., after which the electrodeposition film inside throughholes was removed with a 5 % aqueous lactic acid solution of 50° C.

The conditions of the circuit formed and the copper plating inside throughholes were the same as in Example 1 and very good.

EXAMPLE 4

A circuit board was produced in the same manner as in Example 1 except that the electropaint of Production Example 4 was used and the removal of the resist film and the electrodeposition film was conducted using a 1% aqueous sodium hydroxide solution of 50° C.

The conditions of the circuit formed and the copper plating inside throughholes were the same as in Example 1 and very good.

EXAMPLE 5

Light application (irradiation) and electrodeposition were conducted in the same manner as in Example 1 except that the photosensitive resist solution obtained in Production Example 7 was coated on the same substrate as used in Example 1 by electrostatic spraying in a film thickness (as dried) of 5 μm, heating was conducted at 100° C. for 10 minutes and the dose was 3 mJ/cm$^2$. Then, heating was conducted at 120° C. for 10 minutes, followed by cooling to room temperature. The subsequent procedure, i.e. development, etching and removal of resist film and electrodeposition film were conducted in the same manner as in Example 1, to obtain a circuit board.

The conditions of the circuit formed and the copper plating inside throughholes were the same as in Example 1 and very good.

What is claimed is:

1. A process for producing a printed circuit board, which comprises:

(1) a step of making throughholes in a substrate having an electro-conductive layer on each side and then conducting plating on at least walls of the substrate throughholes, (2) a step of forming a negative photosensitive resist film on each side of the substrate, (3) a step of applying an actinic radiation onto the resist film by a direct drawing method in a shape of a pattern to be obtained, (4) a step of applying, on the walls of the throughholes by electrodeposition, an electropaint capable of forming a film which is insoluble in a developing solution used later and an etching solution used later but is removable with a peeling solution used later, (5) a step of conducting development with an appropriate developing solution to remove a radiation-non-irradiated portion of the negative photosensitive resist film, (6) a step of removing an exposed plating layer portion and an electro-conductive layer portion present therebeneath, by etching, and (7) a step of simultaneously or separately peeling the remaining photosensitive resist film and the electrodeposition film inside the throughholes, with an appropriate peeling solution.

2. A process for producing a printed circuit board, which comprises:

(1) a step of making throughholes in a substrate having an electro-conductive layer on each side and then conducting plating on at least walls of the substrate throughholes, (2) a step of forming a positive photosensitive resist film on each side of the substrate, (3) a step of applying an actinic radiation onto the resist film by a direct drawing method in a shape of a pattern reverse to a pattern to be obtained, (4) a step of applying, on walls of the throughholes by electrodeposition, an electropaint capable of forming a film which is insoluble in a developing solution used later and an etching solution used later but is removable with a peeling solution used later, (5) a step of conducting development with an appropriate developing solution to remove a radiation-irradiated portion of the positive photosensitive resist film, (6) a step of removing an exposed plating layer portion and an electro-conductive layer portion present therebeneath, by etching, and (7) a step of simultaneously or separately peeling the remaining photosensitive resist film and the electrodeposition film inside the throughholes, with an appropriate peeling solution.

3. The process set forth in claim 1 or 2, wherein the plating on walls of the throughholes is conducted by an electroless method or by an electroplating method.

4. The process set forth in claim 1, wherein the negative photosensitive resist comprises:

an unsaturated resin crosslinkable or polymerizable when irradiated with a light, selected from the group consisting of an acrylic resin, a polyester resin, a urethane resin, an epoxy resin and a polybutadiene resin all having a polymerizable unsaturated group in a side chain or backbone chain, a volatile solvent or a compound having at least one polymerizable unsaturated group in a molecule, and a photopolymerization initiator.

5. The process set forth in claim 2, wherein the positive photosensitive resist is a positive liquid photosensitive resist containing a quinone diazide group, or a resist comprising a carboxyl group-containing polymer, a poly(vinyl ether) compound and a compound capable of generating an acid when irradiated with an actinic radiation.

6. The process set forth in claim 1 or 2, wherein the resist film has a thickness of about 3 to about 50 μm.

7. The process set forth in claim 1, wherein the resist film has thereon a resin film of excellent oxygen barrier property.

8. The process set forth in claim 1 or 2, wherein the application of the actinic radiation is conducted by the use of a laser beam of raster mode which is controlled by CAD data and which goes on and off at a high speed in correspondence to a shape of a pattern to be formed, or by the use of a liquid crystal projector.

9. The process set forth in claim 1 or 2, wherein the electropaint is an aqueous solution or aqueous dispersion obtained by neutralizing a composition composed mainly of a resin having an ion-forming group and a curable or crosslinkable group or a functional group reactive with a crosslinking agent, or is an aqueous solution or aqueous dispersion obtained by neutralizing a composition composed mainly of a mixture of said resin and a crosslinking agent.

10. The process set forth in claim 9, wherein the resin is selected from the group consisting of an alkyd resin, a polyester resin, an acrylic resin, an epoxy resin, a styrene-maleic acid copolymer, styrene-maleic anhydride copolymer, a polybutadiene and a vinyl acetate-acrylic acid copolymer.

11. The process set forth in claim 9, wherein the ion-forming group is an anionic group selected from the group consisting of a carboxyl group, a sulfonic acid group and a phosphoric acid group, or an cationic group which is an amino group.

12. The process set forth in claim 9, wherein the curable or crosslinkable group is selected from the group consisting of a thermopolymerizable unsaturated group, an epoxy group and an isocyanate group blocked with a thermally-dissociable protective group.

13. The process set forth in claim 9, wherein the crosslinking agent is selected from the group consisting of a polyepoxy compound, a polyisocyanate blocked with a thermally-dissociable protective group, an amino resin, a polyol compound and a polyfunctional polymerizable unsaturated compound.

\* \* \* \* \*